June 17, 1958 G. R. PAUL 2,839,705
BINARY COUNTING CHAIN
Filed Feb. 21, 1957
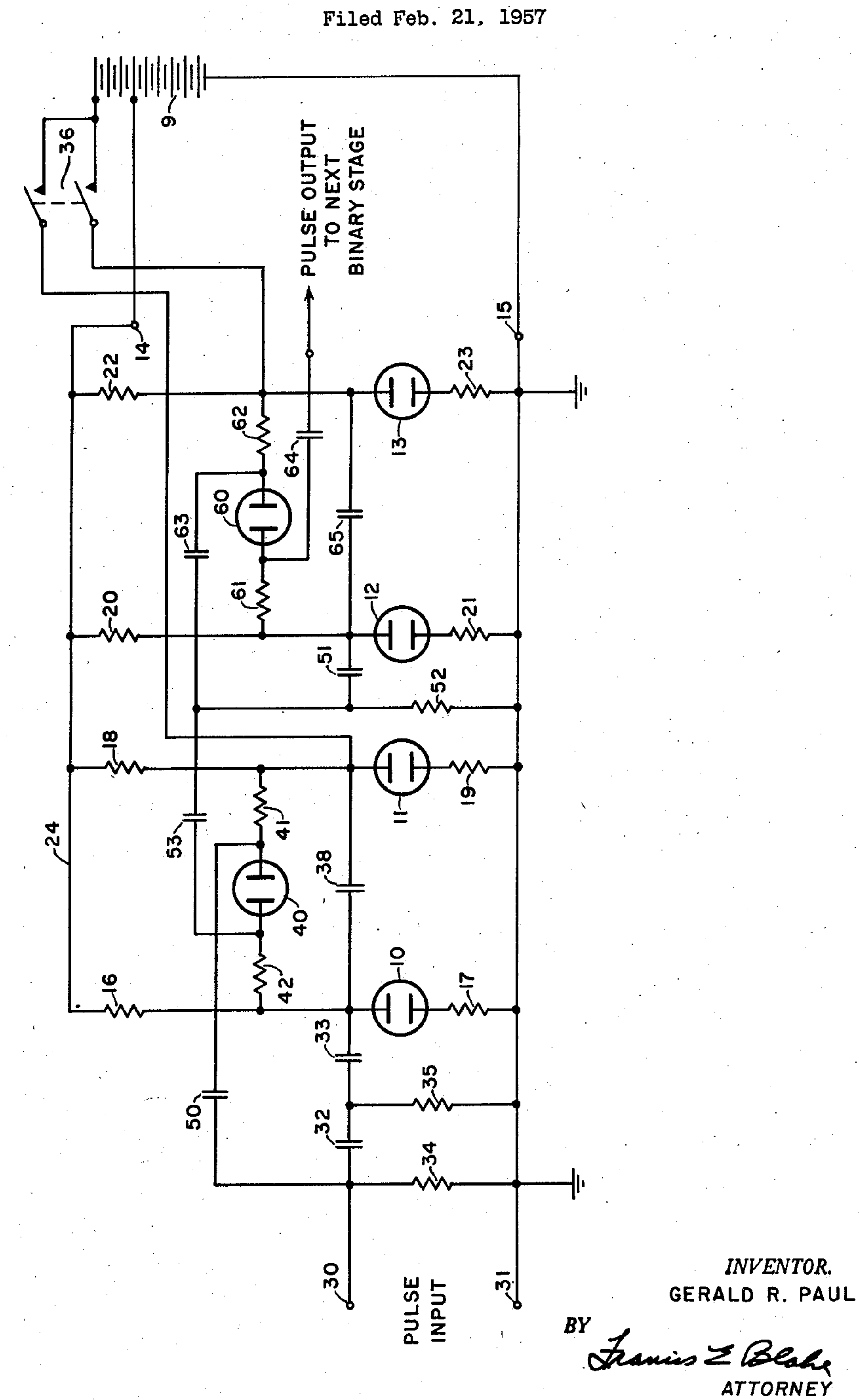
INVENTOR.
GERALD R. PAUL
BY Francis E. Blake
ATTORNEY United States Patent Office 2,839,705

Patented June 17, 1958

2,839,705

BINARY COUNTING CHAIN

Gerald R. Paul, Webster, N. Y., assignor to General Dynamics Corporation, Rochester, N. Y., a corporation of Delaware Application February 21, 1957, Serial No. 641,744

5 Claims. (Cl. 315—84.5)

This invention relates to pulse counting circuits of the binary or scale of two type, and more particularly to a binary counting chain using gaseous diode tubes.

Scale of two counting circuits are well known and are extensively used in counting chains for counting electrical pulses at extremely rapid rates. Considerable developments are being made to simplify pulse counting chains and the more recent developments have provided for the use of simple neon diode tubes for the counting and pulse registration functions. For example, in the copending patent application of Howard L. Foote, Serial No. 536,338, filed September 26, 1955, now Patent No. 2,822,471, a decimal counting chain employing neon gas tubes is disclosed.

It is a principal object of this invention to provide an improved pulse counting chain of the scale of two or binary type employing simple and reliable arrangements to couple each preceding binary stage to each succeeding binary stage.

It is another object of the invention to provide a pulse counting chain of the binary type employing a plurality of tandem connected binary stages having gaseous diode registration devices and gaseous diode coupling devices between successive stages.

Other objects and advantages of this invention will be apparent in the following specification and drawing in which the sole figure is a schematic wiring diagram.

Referring to the drawing, a binary counting chain employing two scale of two or binary stages is disclosed with the first binary stage comprised of gaseous discharge devices or tubes 10 and 11 and the second binary stage comprised of gaseous discharge devices or tubes 12 and 13. The devices 10–13 in the particular embodiment of the invention being described may have at least two electrodes and, for example, may be neon lamps of the type designated NE96. NE96 diodes are constant voltage devices having characteristics which require a direct current potential of approximately at least one hundred and twenty-five volts thereacross to initiate conduction, but which will sustain conduction with a direct current potential thereacross having a minimum value of approximately sixty-five to seventy volts. A suitable source of direct current 9 which energizes the circuits is connected across terminals 14 and 15 with the negative terminal at 15 connected to chassis ground. It should be understood that any number of binary stages, such as that having diodes 10 and 11 or that having diodes 12 and 13, may be connected in tandem to provide the ultimate pulse counting or scaling capacity.

Each of the gaseous diodes 10–13 is connected across the positive and negative terminals 14 and 15 in series with respective ones of voltage dropping resistors 16–23, as shown. More in detail, the first binary stage including diodes 10 and 11 is provided with voltage dropping resistors 16—19 with resistor 16 connected from the positive voltage in line 24 to one electrode of diode 10 and the resistor 17 connected from the other electrode of diode 10 to the negative terminal 15 and chassis ground. Similarly, one electrode of diode 11 is connected through resistor 18 to the positive voltage in line 24 while the other electrode of diode 11 is connected through resistor 19 to chassis ground.

Voltage pulses to be counted are connected across input terminals 30 and 31 and through the differentiation network including capacitors 32, 33 and resistors 34, 35 to the first binary stage including diodes 10 and 11. The right-hand gaseous diodes of each binary stage, such as diodes 11 and 13, are initially primed conductive by momentarily closing switch 36 to apply sufficiently higher direct current voltage across such tubes as to exceed the firing voltage characteristics for the tubes. Thereafter, with switch 36 open, tubes 11 and 13 will remain conductive since the normal voltage drop through resistors 18, 19 and 22, 23 provides a potential across tubes 11 and 13 which exceeds their sustaining voltage characteristics.

The voltage pulses to be counted must have an amplitude and polarity sufficient to add to the voltage normally across any of the gas diodes 10–13 when they are not conducting to provide a total voltage exceeding the firing voltage characteristics of such diodes. The application of the first pulse to the input terminals 30, 31, upon being differentiated by the network including resistors 34 and 35 and capacitors 32 and 33, causes diode 10 to become conductive. Upon the decay of this pulse, diode 11 will be extinguished due to the negative pulse then developed momentarily across capacitor 33. The second voltage pulse of similar characteristics applied across terminals 30 and 31 during its rise in amplitude will have no effect on diode 10 since that diode is a constant voltage device and is then conducting. However, diode 11 again becomes conductive due to the addition of the amplitude of the second pulse to the voltage normally across diode 11. Also, due to the differentiating action provided by resistors 34, 35, together with capacitors 32, 33, a negative pulse will appear across capacitor 33 upon the decay of the second voltage pulse and diode 10 will be thereby extinguished. Thereafter, the third voltage pulse of similar characteristics to be applied across terminals 30 and 31 will, with only the diode 11 conductive, add to the voltage across diode 10 and cause diode 10 to fire while the decay of such voltage pulse will extinguish diode 11, as previously described. Thus, it will be seen that each successive voltage pulse applied across the input terminals 30 and 31 causes diodes 10 and 11 to become alternately and successively conductive and nonconductive.

In order to provide a binary counting chain employing a plurality of successive binary stages with each stage having a pair of gaseous registration tubes such as 10, 11 or 12, 13, a novel gaseous diode coupling network is used. The coupling network for coupling the binary stage, including diodes 10 and 11, to the binary stage including diodes 12 and 13, may be comprised of the gaseous diode device 40 which may be a neon tube of the NE96 type. One electrode of the diode 40 is connected through resistor 41 to the positively connected electrode of diode 11 while the other electrode of diode 40 is connected through resistor 42 to the positively connected electrode of diode 10. The values of resistors 41 and 42, together with resistors 16—19, are chosen such that the potential normally applied across diode 40 is less than its sustaining potential characteristic when only diode 10 of the binary pair, including diodes 10 and 11, is conductive. On the other hand, the values are such that when diode 11 is conductive and diode 10 is not conductive the potential applied across diode 40 exceeds its firing potential characteristic so that such tube is then conductive. The pulses to be counted across pulse input terminals 30 and 31 are coupled by capacitor 50 to one electrode of the coupling diode 40 and by capacitors 53 and 51 from the other electrode of diode 40 to the input circuit for the second binary pair including diode tubes 12 and 13. Capacitor 51 is provided with a resistor 52 to form a differentiating input circuit for the second binary pair. Thus, it will be seen that each second voltage pulse to be counted as applied across a preceding binary pair, such as diodes 10 and 11, is connected by the coupling circuits, such as that having the coupling tube 40, to the next succeeding binary pair including tubes 12 and 13. A similar coupling network including a coupling diode tube 60, resistors 61, 62, and capacitors 63 and 64, is shown to couple the pulse from the second binary pair including diodes 12 and 13 to the next successive binary stage. Although the coupling diode tubes 40 or 60 are shown to be connected in a network between the positively connected electrodes of the binary pair diodes, it should be understood that such coupling networks could be connected between the negatively connected electrodes of each binary pair without departing from the spirit of the invention and assuming that the valuations of the components used are suitably adjusted to provide the required operating voltage conditions as will be apparent to anyone skilled in the art.

The following table of values is given for a typical operating circuit employing NE96 diodes for tubes 10–13, 40 and 60 with an applied direct current voltage of approximately one hundred and twenty-five volts connected across terminals 14 and 15.

| | | |
|---|---|---|
| Resistor **34** | megohms | 1.1 |
| Resistors **41, 42, 61, 62** | do | .1 |
| Resistor **35** | ohms | 3,000 |
| Resistors **16, 20** | do | 50,000 |
| Resistors **17, 21** | do | 1,000 |
| Resistors **18, 22** | do | 15,000 |
| Resistors **19, 23** | do | 5,000 |
| Resistor **52** | do | 8,000 |
| Capacitors **32, 38, 50, 63, 65** | microfarad | .1 |
| Capacitors **51, 53, 64** | do | .5 |
| Capacitor **33** | do | .22 |

Various modifications may be made within the spirit of the invention and the scope of the appended claims.

What is claimed is:

1. In a binary pulse counting chain having a plurality of binary stages in which each stage is comprised of an input circuit and a pair of electronic devices arranged to become alternately and successively conductive when counting each pulse connected to the input circuit of the respective stage, the coupling network for connecting a pulse to be counted between the respective input circuit of successive binary stages whenever a predetermined one of the devices of a respective stage is conductive comprising, a gaseous discharge tube for each stage having at least two electrodes and a minimum applied voltage characteristic for conduction, means connecting one electrode of a respective one of the tubes to one of the devices and the other electrode of the respective tube to the other of the devices of a given stage in a circuit to provide a potential across each tube that is greater than said minimum voltage characteristic only when a predetermined one of the devices of a respective stage is conductive, means to connect the pulses to be counted from the input circuit of one stage to one electrode of said tube, and means to connect the other electrode of said tube to the pulse input circuit of the next successive stage.

2. In a binary pulse counting chain having a plurality of binary stages in which each stage is comprised of an input circuit and a pair of electronic devices arranged to to become alternately and successively conductive when counting each pulse connected to the input circuit of the respective stage, the coupling network for connecting a pulse to be counted between the respective input circuit of successive binary stages whenever a predetermined one of the devices of a respective stage is conductive comprising, a gaseous discharge diode for each stage having a minimum applied voltage characteristic for conduction, means connecting one electrode of a respective one of the diodes to one of the devices and the other electrode of the respective diode to the other of the devices of a given stage in a circuit to provide a potential across each diode that is greater than said minimum voltage characteristic only when a predetermined one of the devices of a respective stage is conductive, means to connect the pulses to be counted from the input circuit of one stage to one electrode of said diode, and means to connect the other electrode of said diode to the pulse input circuit of the next successive stage.

3. In a binary pulse counting chain having a plurality of binary stages in which each stage is comprised of an input circuit and a pair of electronic devices arranged to become alternately and successively conductive when counting each pulse connected to the input circuit of the respective stage, the coupling network for connecting a pulse to be counted between the respective input circuit of successive binary stages whenever a predetermined one of the devices of a respective stage is conductive comprising, a gaseous discharge tube for each stage having at least two electrodes and a first applied voltage characteristic for conduction and a lower applied voltage characteristic for sustaining conduction, means connecting one electrode of a respective one of the tubes to one of the devices and the other electrode of the respective tube to the other of the devices of a given stage in a circuit to provide a potential across each tube that is greater than said first voltage characteristic only when a predetermined one of the devices of a respective stage is conductive and is less than the sustaining voltage characteristic of the respective tube when the other of said devices is conductive, means to connect the pulses to be counted from the input circuit of one stage to one electrode of said tube, and means to connect the other electrode of said tube to the pulse input circuit of the next successive stage.

4. In a binary pulse counting chain having a plurality of binary stages in which each stage is comprised of an input circuit and a pair of electronic devices arranged to become alternately and successively conductive when counting each pulse connected to the input circuit of the respective stage, the coupling network for connecting a pulse to be counted between the respective input circuit of successive binary stages whenever a predetermined one of the devices of a respective stage is conductive comprising, a gaseous discharge diode for each stage having a first applied voltage characteristic for conduction and a lower applied voltage characteristic for sustaining conduction, means connecting one electrode of a respective one of the diodes to one of the devices and the other electrode of the respective diode to the other of the devices of a given stage in a circuit to provide a potential across each diode that is greater than said minimum voltage characteristic only when a predetermined one of the devices of a respective stage is conductive and is less than the sustaining voltage characteristic of the respective tube when the other of said devices is conductive, means to connect the pulses to be counted from the input circuit of one stage of one electrode of said diode, and means to connect the other electrode of said diode to the pulse input circuit of the next successive stage.

5. A scale of two pulse counting circuit comprising a plurality of gaseous discharge conductive devices of the type having at least two electrodes and a minimum voltage characteristic for initiating conduction and a lower minimum voltage characteristic for sustaining conduction, a voltage source, means connecting two of said devices across said source in a manner to apply a voltage across the electrodes of each of said two devices that is higher than their sustaining voltage characteristic but lower than their initiating voltage characteristic, pulse input terminals, pulse output terminals, a differentiating network connected between said input terminals and both of said two devices, means connecting one electrode of another of said devices to one electrode of one of said two devices and the other electrode of said another device to one electrode of the other of said two devices in a manner to provide a voltage across said another device that is higher than its initiating voltage characteristic only when a predetermined one of said two devices is conductive and is lower than its sustaining voltage characteristic only when a predetermined other one of said two devices is conductive, and means connecting said input terminals to said output terminals in series with said another device.

References Cited in the file of this patent

UNITED STATES PATENTS

| | | |
|---|---|---|
| 2,541,041 | Crenshaw | Feb. 13, 1951 |
| 2,558,178 | Hagen | June 26, 1951 |
| 2,583,102 | Holden | Jan. 22, 1952 |
| 2,626,751 | Mullarkey | Jan. 27, 1953 |
| 2,765,426 | Faulkner | Oct. 2, 1956 |
| 2,782,344 | Sharin | Feb. 19, 1957 |
| 2,790,109 | Ruhlig | Apr. 23, 1957 |